(12) United States Patent
Wu et al.

(10) Patent No.: US 7,284,183 B2
(45) Date of Patent: Oct. 16, 2007

(54) METHOD AND APPARATUS FOR DECODING MULTIWORD INFORMATION

(75) Inventors: Wen-Yi Wu, Jhubei (TW); Li-Lien Lin, Hsinchu (TW); Jia-Horng Shieh, Jhonghe (TW)

(73) Assignee: Mediatek Inc. (TW)

( * ) Notice: Subject to any disclaimer, the term of this patent is extended or adjusted under 35 U.S.C. 154(b) by 332 days.

(21) Appl. No.: 10/904,333

(22) Filed: Nov. 4, 2004

(65) Prior Publication Data

US 2006/0101313 A1 May 11, 2006

(51) Int. Cl.
*H03M 13/00* (2006.01)
(52) U.S. Cl. ............... 714/758; 714/762; 714/769; 714/755
(58) Field of Classification Search ............... None
See application file for complete search history.

(56) References Cited

U.S. PATENT DOCUMENTS

| | | | |
|---|---|---|---|
| 6,367,049 B1 | 4/2002 | Van Dijk et al. | |
| 6,378,100 B1 | 4/2002 | Van Dijk et al. | |
| 6,604,217 B1 | 8/2003 | Kahlman | |
| 7,055,082 B2 * | 5/2006 | Mori et al. | 714/768 |
| 7,058,875 B2 * | 6/2006 | Jeon et al. | 714/769 |
| 2003/0103429 A1 * | 6/2003 | Senshu | 369/47.24 |
| 2003/0208714 A1 | 11/2003 | Kahlman | |
| 2005/0015698 A1 * | 1/2005 | Kim et al. | 714/758 |
| 2005/0022096 A1 * | 1/2005 | Kim et al. | 714/762 |
| 2005/0154959 A1 * | 7/2005 | Van Dijk et al. | 714/758 |

(Continued)

FOREIGN PATENT DOCUMENTS

EA    1 453 209    9/2004

(Continued)

OTHER PUBLICATIONS

Narahara, Tatsuya et al. Optical Disc System for Digital Video Recording. Japanese Journal of Applied Physics. vol. 39 (2000) pp. 912-919.

(Continued)

*Primary Examiner*—Guy Lamarre
*Assistant Examiner*—Sam Rizk
(74) *Attorney, Agent, or Firm*—Connolly Bove Lodge & Hutz LLP

(57) ABSTRACT

A method for decoding multiword information comprises steps (a) to (h). In step (a), a multiword information cluster including high protective words and low protective words is provided, wherein the multiword information, high protective words and low protective words can be ECC data, BIS data and LDC data, respectively. In step (b), the low protective words are partitioned into multiple groups. In step(c), the low protective words are de-interleaved, so as to generate a low protective word cluster including multiple segments corresponding to the multiple groups. In step (d), any error of the low protective words is detected, so as to generate segment erasure indicators with localities. In step (e), the low protective words and the segment erasure indicators are stored into a first memory, e.g., a DRAM. In step (f), the segment erasure indicators are stored into a second memory, e.g., a SRAM. In step (g), erasure bits of the low protective word are generated based on the segment erasure indicators. In step (h), the low protective words read from the first memory are decoded by means of the erasure bits.

39 Claims, 20 Drawing Sheets

U.S. PATENT DOCUMENTS

2005/0229085 A1* 10/2005 Van Dijk et al. ........... 714/781

FOREIGN PATENT DOCUMENTS

WO    WO-03/085839    10/2003

OTHER PUBLICATIONS

Wim Coene et al.. Channel Coding and Signal Processing for Optical Recording Systems Beyond DVD. IEEE Transactions on Magnetics, vol. 37, No. 2, Mar. 2001. pp. 682-688.

ANONYMOUS: "White paper Blu-ray Disc Format, 1.B Physical Format Specifications for BD-R" Internet Article, Online. Aug. 2004.

\* cited by examiner

|  | First Row | | | | Second Row | | | |
|---|---|---|---|---|---|---|---|---|
|  | SYNC | BIS1 | BIS2 | BIS3 | SYNC | BIS1 | BIS2 | BIS3 |
| Address | 0 | 1 | 2 | 3 | 4 | 5 | 6 | 7 |
| Data | S0 | 0 | 0 | 0 | S1 | 0 | 0 | 0 |

FIG. 5(b)

|  | First Row | | | | Second Row | | | |
| --- | --- | --- | --- | --- | --- | --- | --- | --- |
|  | SYNC | BIS1 | BIS2 | BIS3 | SYNC | BIS1 | BIS2 | BIS3 |
| Address | 0 | 1 | 2 | 3 | 4 | 5 | 6 | 7 |
| Data | 0 | 1 | 0 | 1 | 1 | 0 | 1 | 0 |

FIG. 5(c)

| | Row n | Row n+1 | Row n+2 | Row n+3 | Row n+4 | Row n+5 | Row n+6 | Row n+7 |
|---|---|---|---|---|---|---|---|---|
| | SYNC | SYNC | SYNC | SYNC | SYNC | SYNC | SYNC | SYNC |
| Bit | 0 | 1 | 2 | 3 | 4 | 5 | 6 | 7 |
| Data | | | | | | | | |

Byte k

| | Row n | Row n+1 | Row n+2 | Row n+3 | Row n+4 | Row n+5 | Row n+6 | Row n+7 |
|---|---|---|---|---|---|---|---|---|
| | BIS1 | BIS1 | BIS1 | BIS1 | BIS1 | BIS1 | BIS1 | BIS1 |
| Bit | 0 | 1 | 2 | 3 | 4 | 5 | 6 | 7 |
| Data | | | | | | | | |

Byte k+1

| | Row n | Row n+1 | Row n+2 | Row n+3 | Row n+4 | Row n+5 | Row n+6 | Row n+7 |
|---|---|---|---|---|---|---|---|---|
| | BIS2 | BIS2 | BIS2 | BIS2 | BIS2 | BIS2 | BIS2 | BIS2 |
| Bit | 0 | 1 | 2 | 3 | 4 | 5 | 6 | 7 |
| Data | | | | | | | | |

Byte k+2

| | Row n | Row n+1 | Row n+2 | Row n+3 | Row n+4 | Row n+5 | Row n+6 | Row n+7 |
|---|---|---|---|---|---|---|---|---|
| | BIS3 | BIS3 | BIS3 | BIS3 | BIS3 | BIS3 | BIS3 | BIS3 |
| Bit | 0 | 1 | 2 | 3 | 4 | 5 | 6 | 7 |
| Data | | | | | | | | |

Byte k+3

|  | ← | | | 19 codewords | | | → |
|---|---|---|---|---|---|---|---|
| ↓ | $d_{0,A}$ | $d_{216,A}$ | : | $d_{1944,A}$ | $d_{108,B}$ | : | $d_{1836,B}$ |
| | $d_{1,A}$ | $d_{217,A}$ | : | $d_{1945,A}$ | $d_{109,B}$ | : | $d_{1837,B}$ |
| | $d_{2,A}$ | : | : | : | : | : | : |
| | $d_{3,A}$ | : | : | : | : | : | : |
| | ↓ | ↓ | : | ↓ | ↓ | : | ↓ |
| | : | : | : | $d_{2047,A}$ | : | : | : |
| | : | : | : | $e_{2048,A}$ | : | : | : |
| 216 rows with data | : | : | : | : | : | : | : |
| | : | : | : | $e_{2051,A}$ | : | : | : |
| | : | : | : | $d_{0,B}$ | : | : | : |
| | : | : | : | $d_{1,B}$ | : | : | : |
| | ↓ | ↓ | : | ↓ | ↓ | : | ↓ |
| | : | : | : | : | : | : | $d_{2047,B}$ |
| | : | : | : | : | : | : | $e_{2048,B}$ |
| | : | : | : | $d_{106,B}$ | : | : | : |
| ↓ | $d_{215,A}$ | $d_{431,A}$ | : | $d_{107,B}$ | $d_{323,B}$ | : | $e_{2051,B}$ |

FIG. 8(b)

METHOD AND APPARATUS FOR DECODING MULTIWORD INFORMATION

BACKGROUND OF THE INVENTION (A) Field of the Invention

The present invention is related to a method and an apparatus for decoding multiword information, which are applied to an optical disc device.

(B) Description of the Related Art

As shown in FIG. 1, an Error Correction Code (ECC) cluster 10 includes 152 long-distance code (LDC) data columns, one SYNC data column 11 and three burst indicator subcode (BIS) data columns 12, and the LDC data columns are separated into four LDC blocks 13 by the SYNC data column 11 and three BIS data columns 12. The original LDC data are discontinuous and interleaved into different LDC blocks 13. Some ECC encoding or decoding techniques were developed as shown in U.S. Pat. No. 6,378,100, U.S. Pat. No. 6,367,049, U.S. Pat. No. 6,604,217 and US 2003/0208714, wherein U.S. Pat. No. 6,378,100 disclosed a method for encoding multiword information, i.e., generating a so-called blue ray disc specification, U.S. Pat. No. 6,367,049 disclosed an encoding method by interleaving, U.S. Pat. No. 6,604,217 disclosed a decoding method using synchronization (SYNC) codes, BIS codes or their dynamic or static combination as an erasure, and US 2003/0208714, a continuation application of U.S. Pat. No. 6,604,217, disclosed a method using SYNC code as an erasure indicator. Further, Narahara et al. disclosed an error correction method using LDC and BIS codes that was published in Japan. J. Appl. Phys. Vol. 39 (2000) pp. 912-919.

However, the patents and article mentioned above only raised concepts for decoding ECC data, i.e., they did not explicitly disclose practical implementation methods. Under the circumstances, it is necessary to develop a useful implementation method and apparatus for decoding ECC data, even if based on the existing concepts.

SUMMARY OF THE INVENTION

The objective of the present invention is to provide a method and an implementation apparatus for effectively decoding multiword information cluster, e.g., ECC cluster. More specifically, the method and the apparatus of the present invention are mainly used for decoding the LDC data of an ECC cluster. Currently, the method and apparatus of the present invention can be applied to a so-called blue ray disc decoding.

Normally, the LDC erasure bits are stored in a memory, e.g., a dynamic random access memory (DRAM). However, the LDC data are interleaved in the ECC cluster, i.e., the original LDC data are discontinuous and disposed in multiple LDC blocks, so the location of each LDC data has to be retrieved from the DRAM individually. Thus, the DRAM bandwidth will be reduced if all the erasure indicators are stored in the DRAM, and therefore the decoding efficiency will be decreased.

To increase the LDC data decoding efficiency, a method for decoding multiword information is disclosed. The method comprises steps (a) to (h). In step (a), a multiword information cluster including high protective words and low protective words is provided, wherein the multiword information, high protective words and low protective words can be ECC data, BIS data and LDC data, respectively. In step (b), the low protective words are partitioned into multiple groups, so as to generate a low protective word cluster including multiple segments corresponding to the multiple groups. In step (c), any error flag of the low protective words is detected, so as to generate segment erasure indicators with localities. In step (d), the low protective words are de-interleaved. In step (e), the de-interleaved low protective words and the segment erasure indicators are stored into a first memory, e.g., a DRAM. In step (f), the segment erasure indicators are stored into a second memory, e.g., a static random access memory (SRAM). In step (g), erasure bits of the low protective word are generated based on the segment erasure indicators. In step (h), the low protective words read from the first memory are decoded by means of the erasure bits.

The method mentioned above can be implemented by an apparatus comprising a segment error generator, a first memory, a second memory, an erasure generator and a decoder, the segment error generator being operative to detect any error of the multiple segments so as to generate segment erasure indicators showing where errors occur, the first memory being electrically coupled to the segment error generator for storing the low protective words and the segment erasure indicators, the second memory being used for storing the segment erasure indicators read from the first memory, the erasure generator being electrically coupled to the second memory for generating erasure bits for the low protective words based on the segment erasure indicators, and the decoder being electrically coupled to the first memory and the erasure generator for decoding the low protective words by the erasure bits.

BRIEF DESCRIPTION OF THE DRAWINGS

FIGS. 5(b), 5(c) and 5(d) illustrate SYNC erasure indicators and BIS erasure indicators stored in an SRAM in accordance with the present invention;

FIGS. 6(a) through 6(c) illustrate BIS data composed of address field information and user control data;

FIG. 8(b) illustrates the LDC data of the first and second sectors after de-interleaving;

DETAILED DESCRIPTION OF THE PREFERRED EMBODIMENTS

Figure 1:
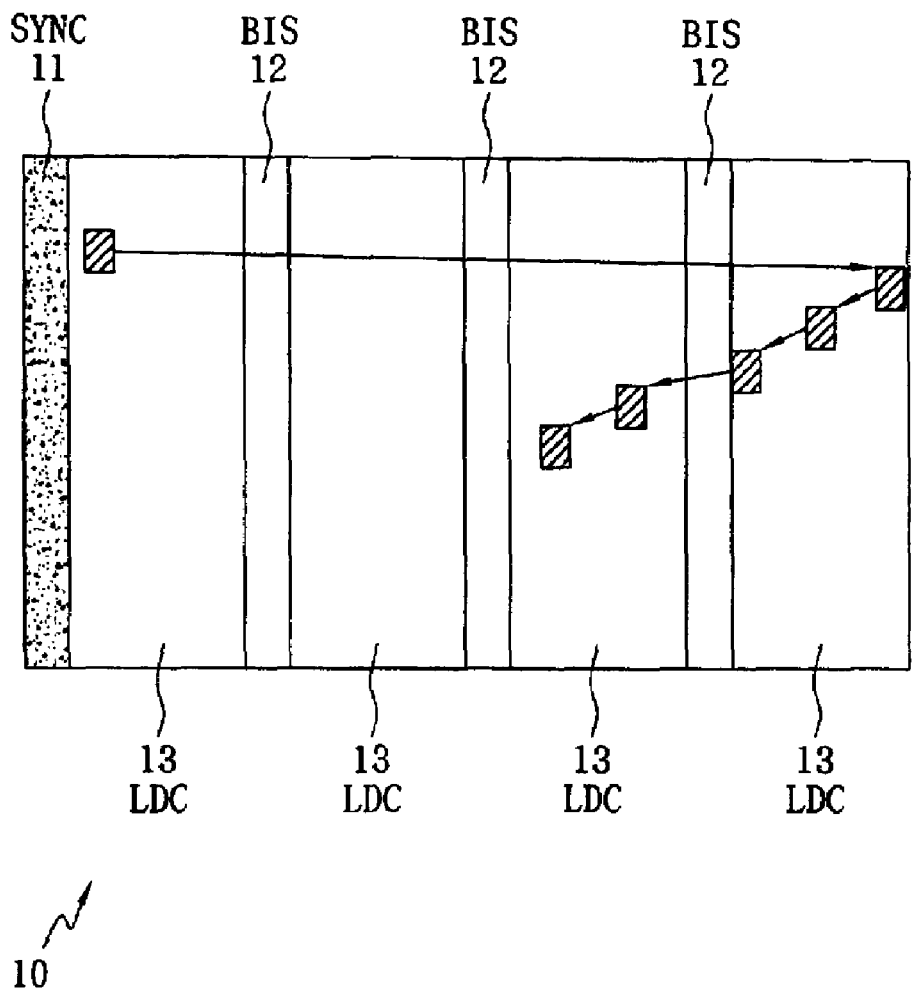
FIG. 1 illustrates a known ECC cluster.
Figure 2A:
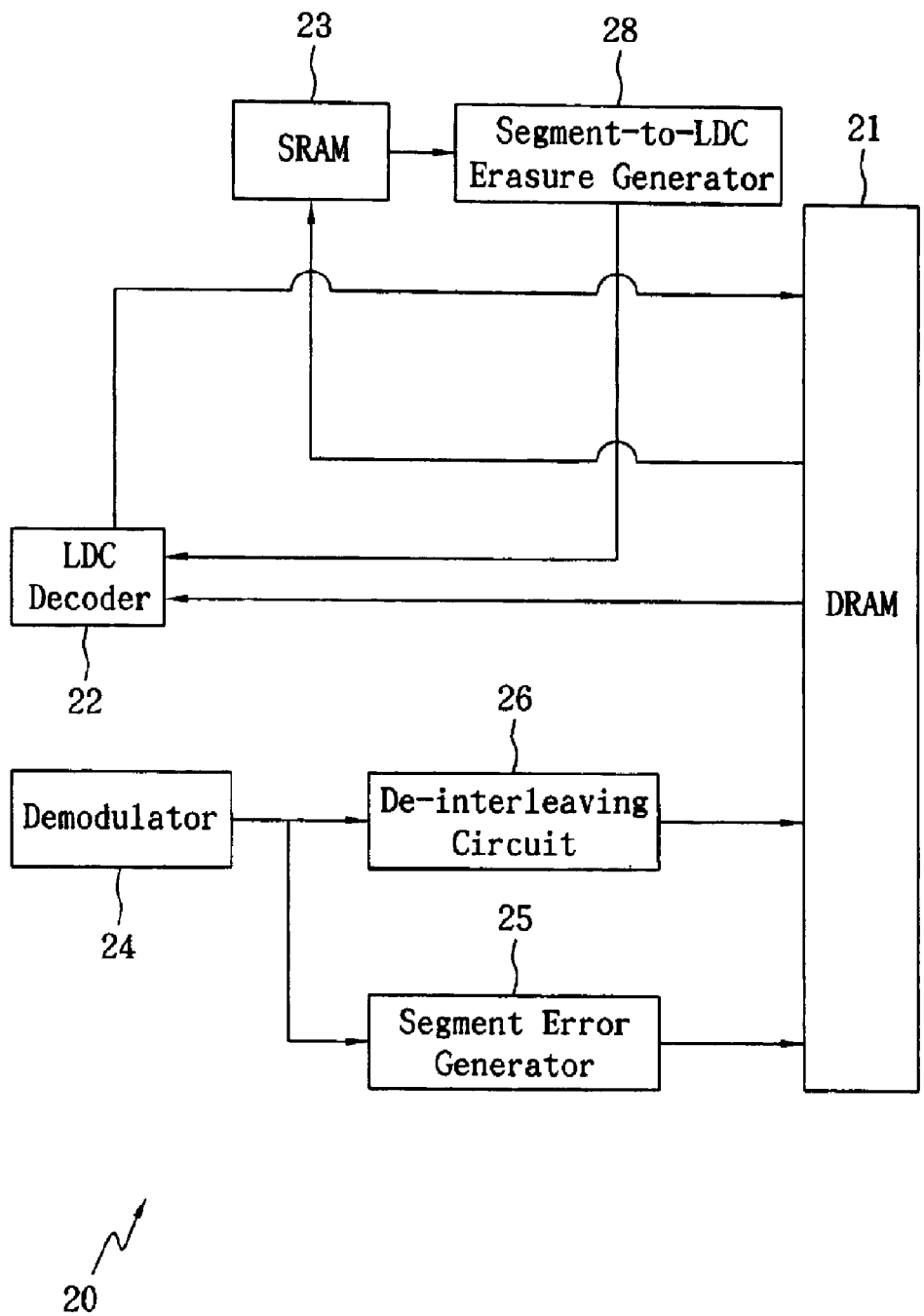
FIGS. 2(a), 2(b), 2(c) and 2(d) illustrate apparatuses for decoding LDC data of the first embodiment in accordance with the present invention.

FIG. 2(a) is a schematic view of an apparatus 20 for decoding multiword information in accordance with the present invention. The apparatus 20 includes a first memory, e.g., DRAM 21, an LDC decoder 22, a second memory, e.g., SRAM 23, a demodulator 24, a segment error generator 25, a de-interleaving circuit 26, a Segment-to-LDC erasure generator 28.

Figure 3:
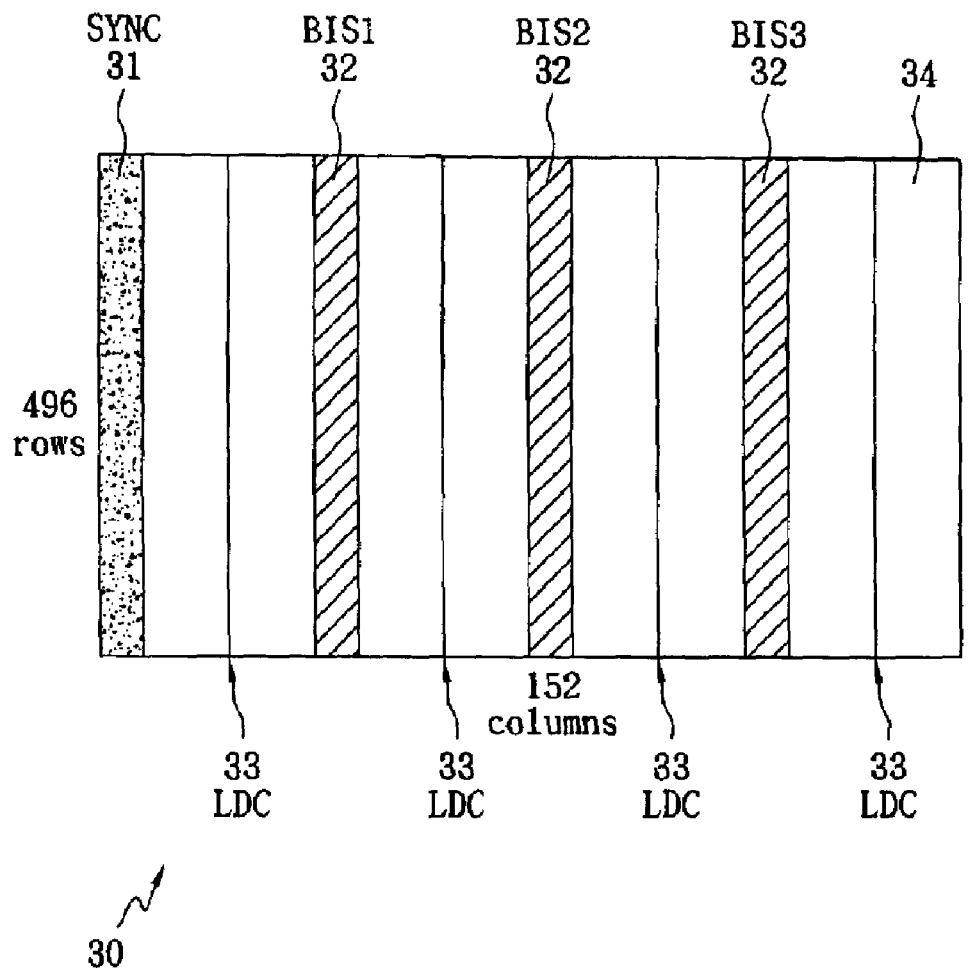
FIG. 3 illustrates an ECC cluster for explaining the method in accordance with the present invention.

As shown in FIG. 3, an ECC cluster 30 includes a SYNC code column 31, three BIS data columns 32 and four LDC blocks 33, each of which has 38 LDC data columns, i.e., there are 152 LDC data columns in total. Besides, the ECC cluster 30 has 496 rows. The three BIS data columns 32, from left to right, are denoted by BIS 1, BIS 2 and BIS 3, respectively. If all the LDC data are partitioned into eight segments 34 in the ECC cluster 30, each segment 34 includes nineteen LDC data columns.

Referring back to FIG. 2(a), the LDC data in the ECC cluster 30 are demodulated to be of 8-bit data through the demodulator 24, and then the LDC data are de-interleaved by de-interleaving circuit 26 and stored in the memory 21, e.g., DRAM.

A demodulation error flag signal may accompany with the LDC data to indicate the error locative clues of demodulated data. For example, if the channel bits fail to be demodulated to proper 8-bit LDC data, the demodulation error flag signal will be set to indicate there might be an error in that LDC data. Alternatively, any method to indicate possible error before or during demodulation can also be a good error flag. For example, the preceding reading channel detects unstable channel bits where data cannot be demodulated correctly, a defect occurs, or the number of the channel bits between two synchronous codes is unexpected.

Figure 4A:
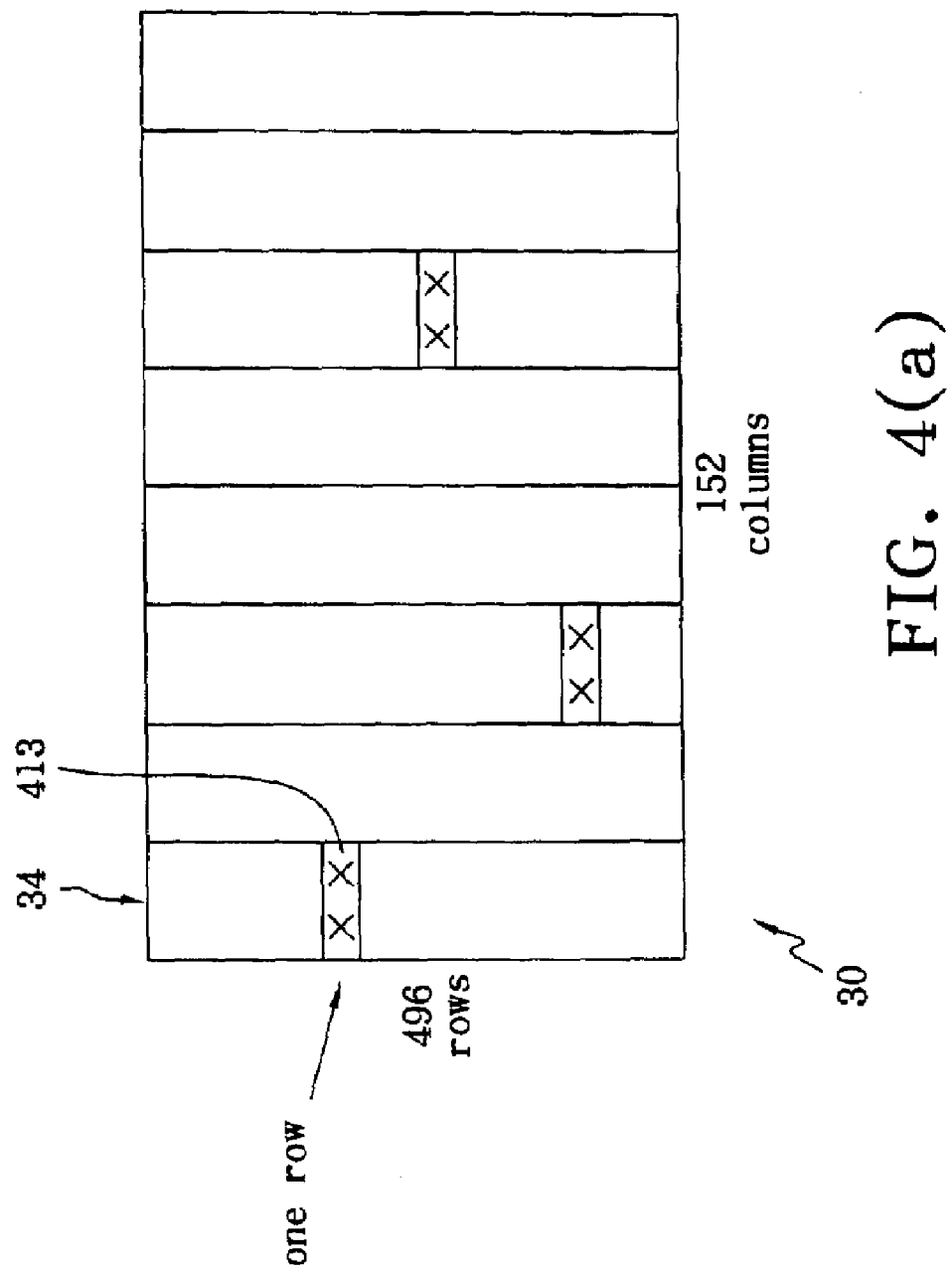
FIGS. 4(a) and 4(b) illustrate an LDC cluster marked with segment erasure indicators.
Figure 4B:
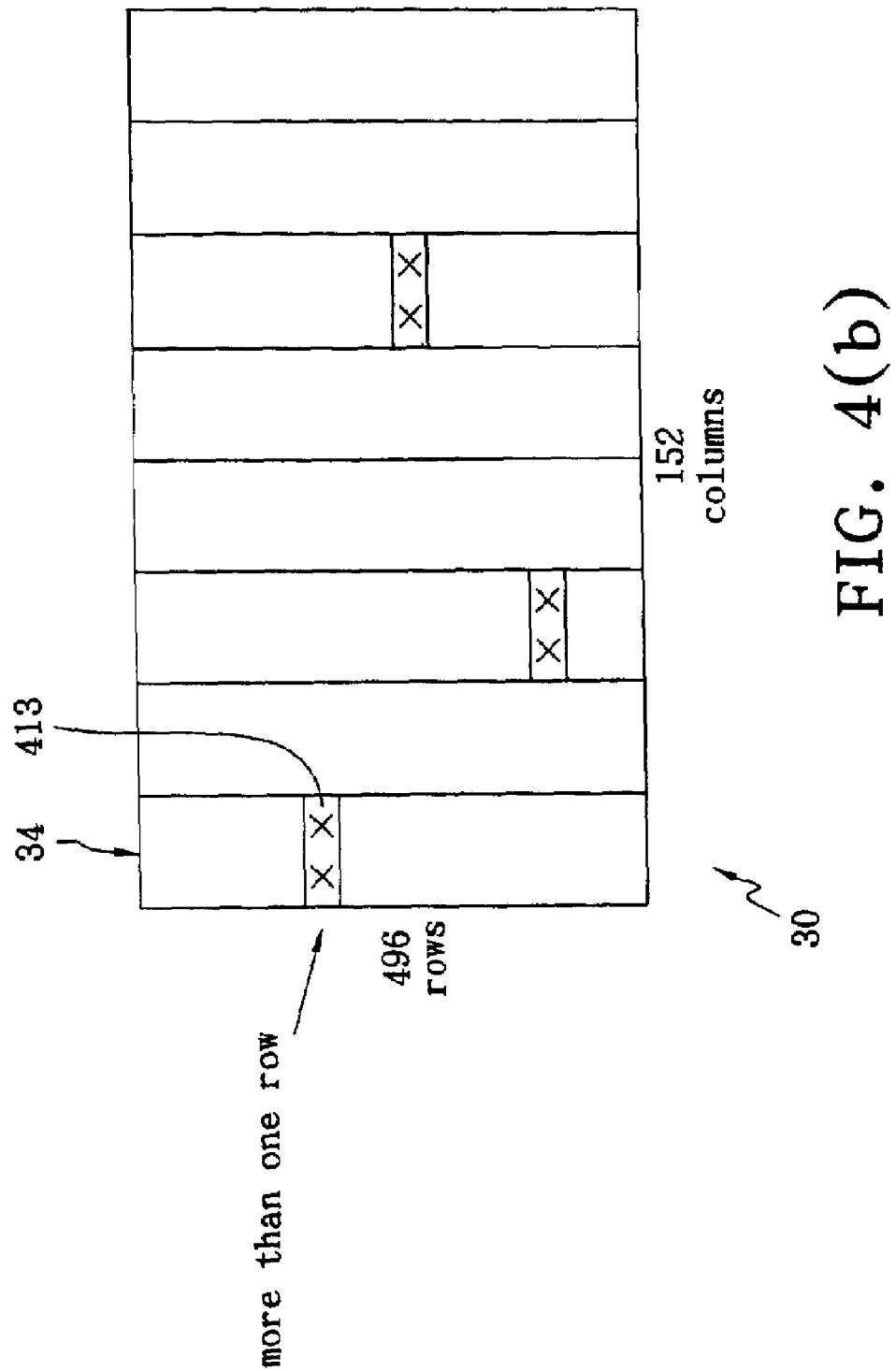

As shown in FIG. 4(a), if the number of demodulation error flags in nineteen LDC data of a row of a segment 34 exceeds a threshold value, a segment erasure indicator 413 will be marked on the segment 34 with locality to indicate the error locative clue of the segment 34. For instance, if the number of demodulation error flags exceeds the threshold value, the segment erasure indicator will be assigned to "1," otherwise to "0." Consequently, the segment error generator 25 in FIG. 2(a) functions as a counter, so as to calculate the number of demodulation error flags, and therefore to generate a segment erasure indicator. Accordingly, there are one bit for each row of a segment 34 to store the segment erasure indicator, and thus 496 bytes (496×8÷8=496) in total are needed to store all the segment erasure indicators for the LDC cluster 30. Referring to FIG. 3 again, if every single demodulation error flag for all LDC data needs to be recorded, a memory volume of 9424 bytes (496×152÷8=9424) is needed. Apparently, the above method of the present invention can tremendously decrease the memory volume for storing segment erasure indicators. A proper size of segment group can be chosen based on the required memory bandwidth or memory volume. Alternatively, as shown in FIG. 4(b) if the number of demodulation error flags in LDC data of more than one rows of a segment exceeds the threshold value, the segment erasure indicator will be marked. Further, the segment erasure indicator can also marked when the sum of the number of demodulation error flags in LDC and a weighting number multiplying by the number of demodulation error flags in BIS exceeds a threshold value, i.e., if demodulation error flags in multiple rows larger than the threshold value, indicating a segment erasure indicator in this segment area.

Figure 2B:
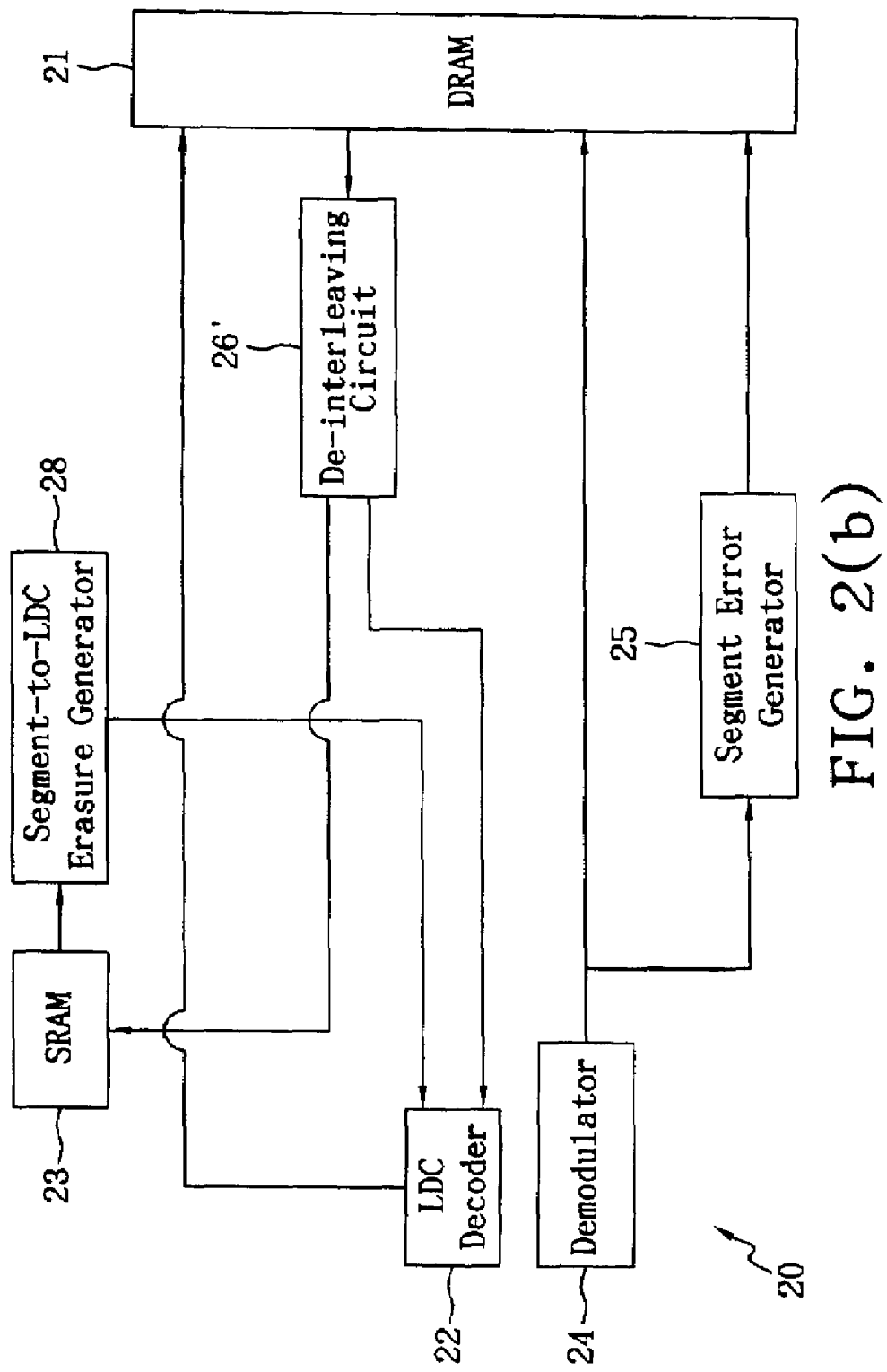
Figure 2C:
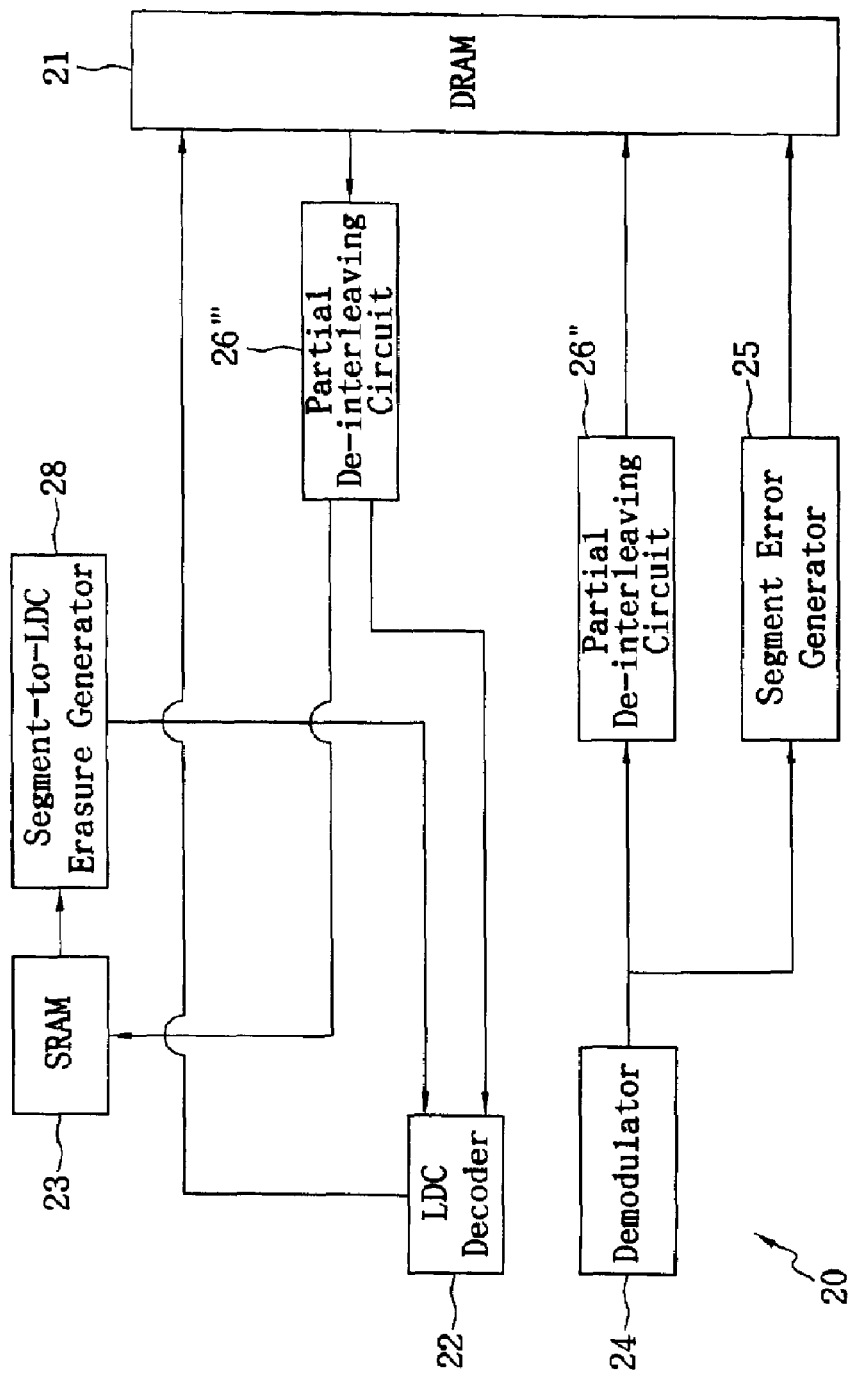

Sequentially, the segment erasure indicators and the de-interleaved LDC data are stored in the DRAM 21. Alternatively, a de-interleaving circuit 26' can also be disposed between the DRAM 21 and SRAM 23/LDC decoder 22, and thus the LDC and BIS data are stored in the DRAM 21 before de-interleaving as shown in FIG. 2(b). Another alternative method is that the DRAM 21 stores a partial de-interleaving LDC and BIS data, and the rest of LDC and BIS data are de-interleaved while being read from DRAM as shown in FIG. 2(c), wherein a partial de-interleaving circuit 26" and another partial de-interleaving circuit 26'" are employed.

Figure 2D:
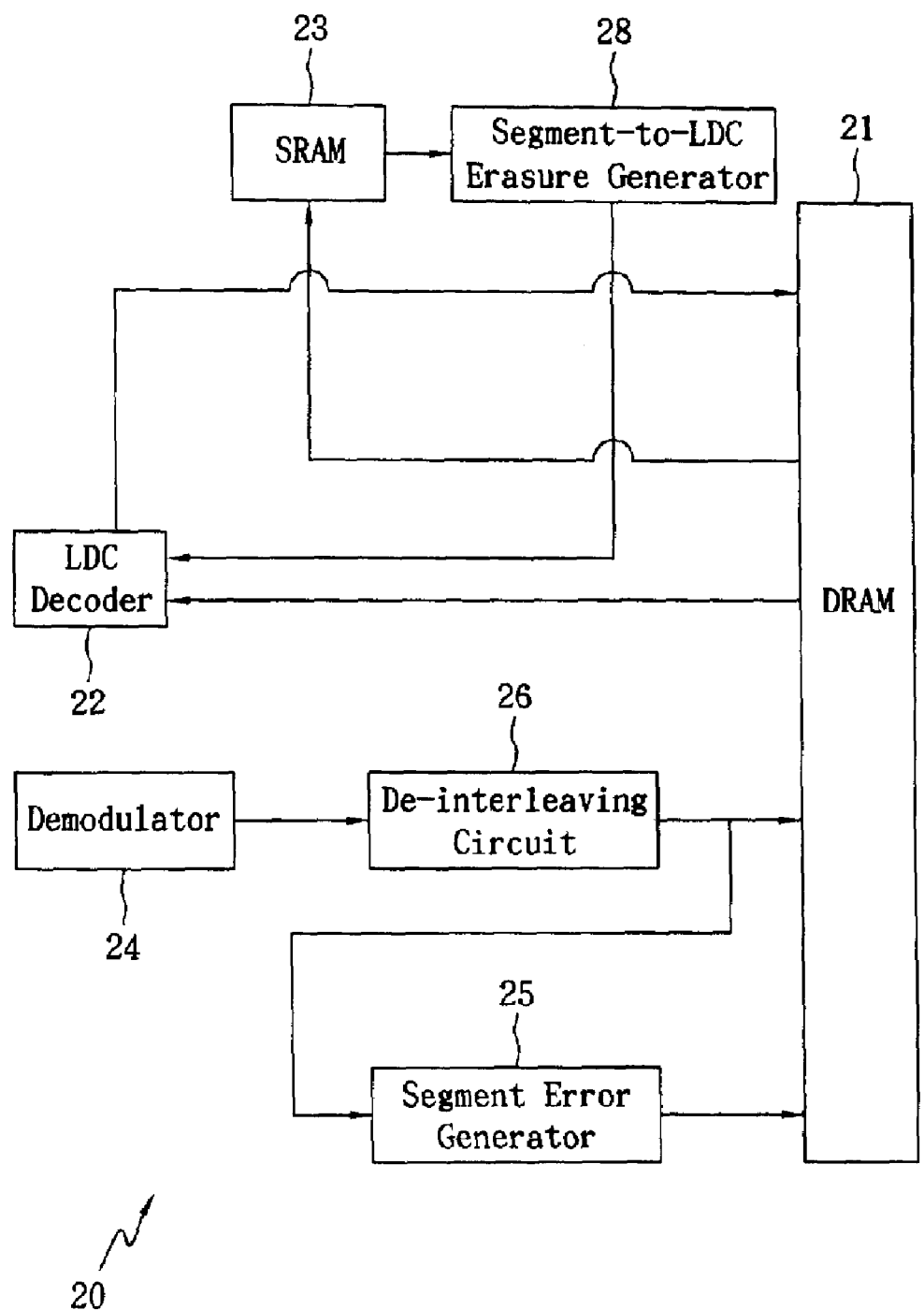

The segment group could also be partitioned after LDC data de-interleaved. As shown in FIG. 2(d), the input of the segment error generator 25 is electrically coupled to the output of the de-interleaving circuit 26, i.e., the segment error is calculated by after the LDC data and the demodulation error flags are de-interleaved. An alternative method is that the segment group could be partitioned after LDC data partial de-interleaved.

Before data decoding, the segment error indicators are read from the DRAM 21 and stored into the SRAM 23. When an LDC codeword is being decoded, the Segment-to-LDC erasure generator 28 retrieves the segment erasure indicator with respect to the LDC codeword from the SRAM 23 so as to generate an LDC erasure bit with locality, and the LDC erasure bit as well as the LDC data stored in the DRAM 21 is transmitted into the LDC decoder 22 for decoding LDC codeword. The segment error indicators and LDC data may be stored in different memories. Such as FIG. 10, the segment error indicator is stored in SRAM 27 which is isolated from DRAM 21 for LDC data.

In practice, a BIS erasure indicator and/or SYNC error indicator can also be chosen as an alternative to generate an LDC erasure bit. These two indicators may also combine with aforementioned segment error indicator to generate an LDC erasure bit. If the SYNC errors are detected, SYNC erasure indicator will be assigned by "1," otherwise by "0." As to the determination of the SYNC error, if the data received at the SYNC position is different from SYNC pattern before demodulation, e.g., SYNC0 pattern in Blu-Ray=01 010 000 000 010 000 000 010 or the number of data between two close SYNC columns 31 in FIG. 3 is incorrect, any discontinuous SYNC code is found, or the read channel shows that the data near/on SYNC code is not reliable, they can be deemed to be a SYNC error.

Figure 5A:
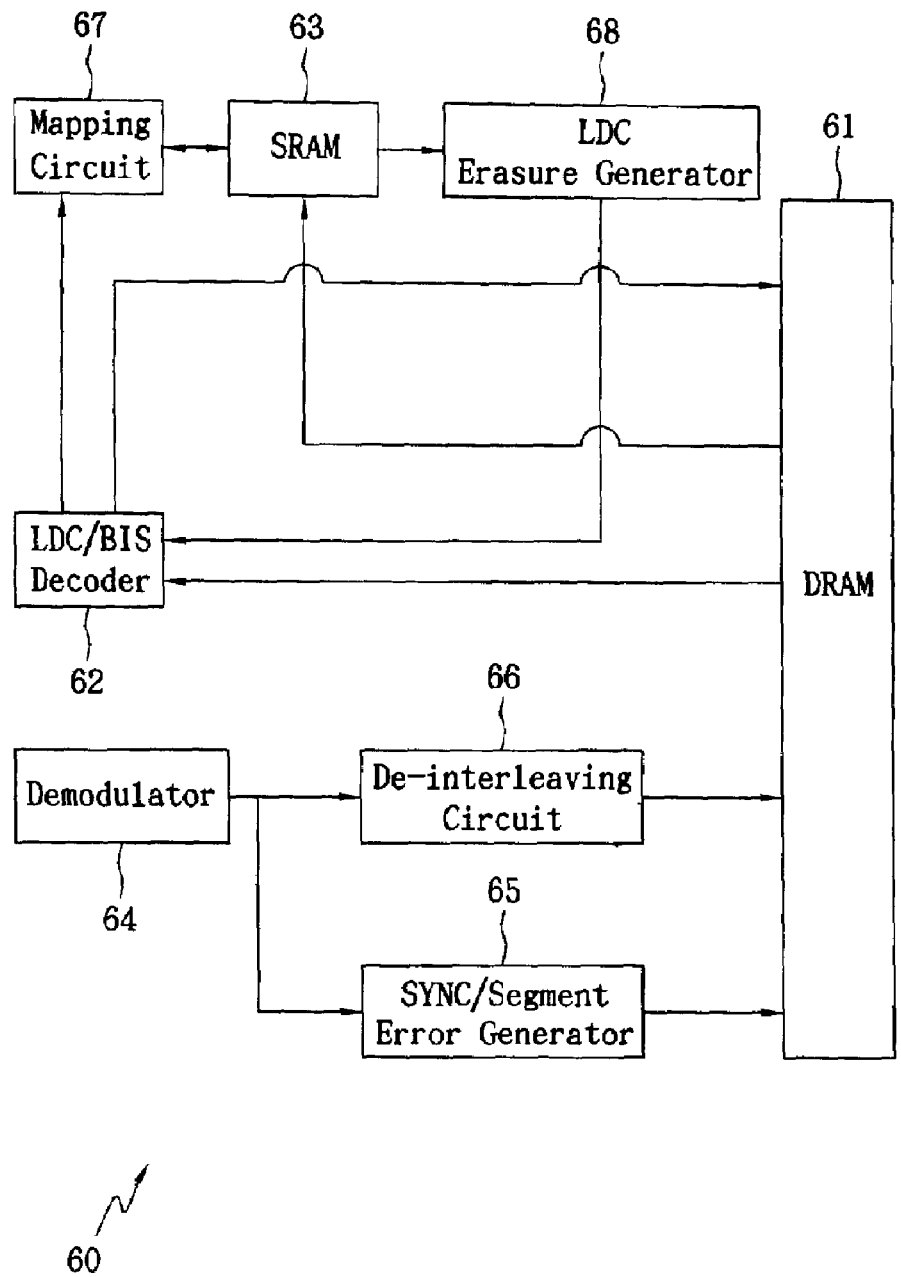
FIG. 5(a) illustrates an apparatus for decoding LDC clusters of the second embodiment in accordance with the present invention.

FIG. 5(a) illustrates the decoding apparatus of another embodiment. An apparatus 60 includes a first memory, e.g., DRAM 61, an LDC/BIS decoder 62, a second memory, e.g., SRAM 63, a demodulator 64, a SYNC/segment error generator 65, a de-interleaving circuit 66, a mapping circuit 67 and an LDC erasure generator 68. In comparison with the embodiment shown in FIG. 2(a), BIS erasure indicator and/or SYNC error indicator are further introduced as another erasure indicator. Likewise, if errors are detected during BIS data decoding, the BIS erasure indicators are assigned to "1," otherwise to "0."

The BIS erasure indicators go through the mapping circuit 67 to relocate themselves, the corresponding BIS data of which in the ECC cluster 30 are pointed out so as to establish the location relation between the BIS erasure indicators and the BIS data in the ECC cluster 30.

A possible mapping function of the mapping circuit 67 is shown as follows:

$$(N,C) \rightarrow (u \times 31 + r, e),$$

where (N,C) is the location in BIS block; N indicates the location in one BIS code (0~61); C indicates the BIS code number (0~23);

and where (u,r,e) indicates the location in BIS cluster; u (unit number)=mod({div(N,2)+8−div(C,3)},8)+8×mod(N,2); r (row number)=div(N,2); e (column number)=mod({C+div(N,2)},3).

Afterwards, the BIS erasure indicators with localities are stored in the SRAM 63. In addition, the SYNC erasure indicators can be transmitted to and stored in the SRAM 63. Consequently, there are four possible erasure indicators generated in each row of the ECC cluster 30, so four bits are employed to store the possible SYNC erasure indicator and three BIS erasure indicators. Accordingly, one byte can store erasure indicators of two rows in an ECC cluster, and 248 bytes (496×4/8=248) are needed for each ECC cluster.

In the beginning of decoding an ECC cluster, the SRAM 63 has to be initialized to overwrite previous data therein, i.e., the fields of SYNC erasure indicators in the SRAM 63 are overwritten by the SYNC erasure indicators stored in the DRAM 61, and BIS erasure indicators are all reset to be zero. FIG. 5(*b*) illustrates a byte in the SRAM 63 that is initialized, where the SYNC erasure indicators of address 0 and address 4 are assigned by the SYNC erasure indicators S0 and S1 in the DRAM 61. S0 is the sync. erasure indicator of the first row, whereas S1 is the sync. erasure indicator of the second row, and the BIS erasure indicators are reset to "0."

FIG. 5(*c*) illustrates an example of erasure indicators stored in the SRAM 23, wherein the SYNC as well as BIS2 fields of the second row and BIS1 as well as BIS 3 fields of the first row exhibit errors. The situations mean that errors may occur in the LDC data close to or between the error-exhibiting SYNC or BIS data in the same row of the ECC cluster.

As shown in FIG. 5(*b*), 1 byte of the SRAM 23 in FIG. 2(*a*) comprises SYNCs of the first and second rows and BIS erasure indicator. Alternatively, 1 byte of the SRAM 23 can also comprises the erasure indicators in the column direction. The BIS, SYNC or segment erasure indicators can also be stored along the columns instead of rows. As shown in FIG. 5(*d*), the SYNC, BIS1 erasure indicator, BIS2 erasure indicator and BIS3 erasure indicator of row "n" are respectively stored in the bit "0" of Byte k, Byte k+1, Byte k+2 and Byte k+3 of a SRAM, whereas the SYNC, BIS1 erasure indicator, BIS2 erasure indicator and BIS3 erasure indicator of row "n+1" are respectively stored in the bit "1" of Byte k, Byte k+1, Byte k+2 and Byte k+3 of the SRAM. The erasure indicators can also be stored by any other mapping formats which will benefit to the writing and/or reading efficiency of SRAM 23. For example, the erasure indicators can be stored by the sequence for LDC's decoding or by the positions of the BIS or SYNC errors or by the format of $\alpha^{loc_i}$, wherein α is the root of primitive polynomial, and $loc_i$ is the number i which the erasure bit of the i-th word in an LDC codeword is not zero.

When an LDC codeword is being decoded, the LDC erasure generator 68 retrieves the segment, BIS and SYNC erasure indicators corresponding to the LDC codeword from the SRAM 63. Consequently, an erasure bit can be generated based on the segment, BIS or SYNC erasure indicators, i.e., an erasure bit is generated in the light of the segment erasure indicator, or by mapping the LDC data location back to the ECC cluster and looking up the BIS erasure indicators stored in the SRAM 63, or by the integration these indicators. Sequentially, the LDC erasure bit is transmitted into the LDC/BIS decoder 62 to correct the relevant LDC data, and the corrected LDC data are sent back to the DRAM 61.

Figure 6A:
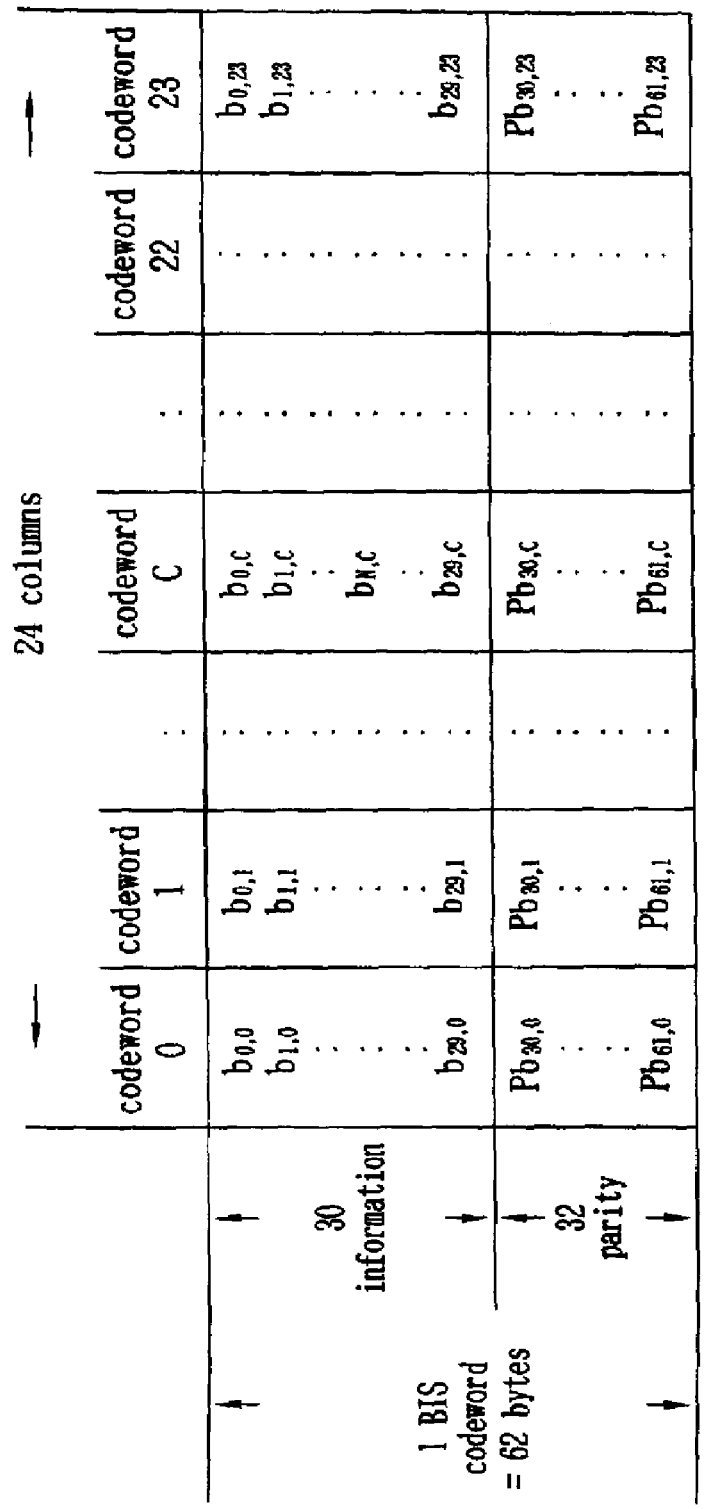
Figure 6B:
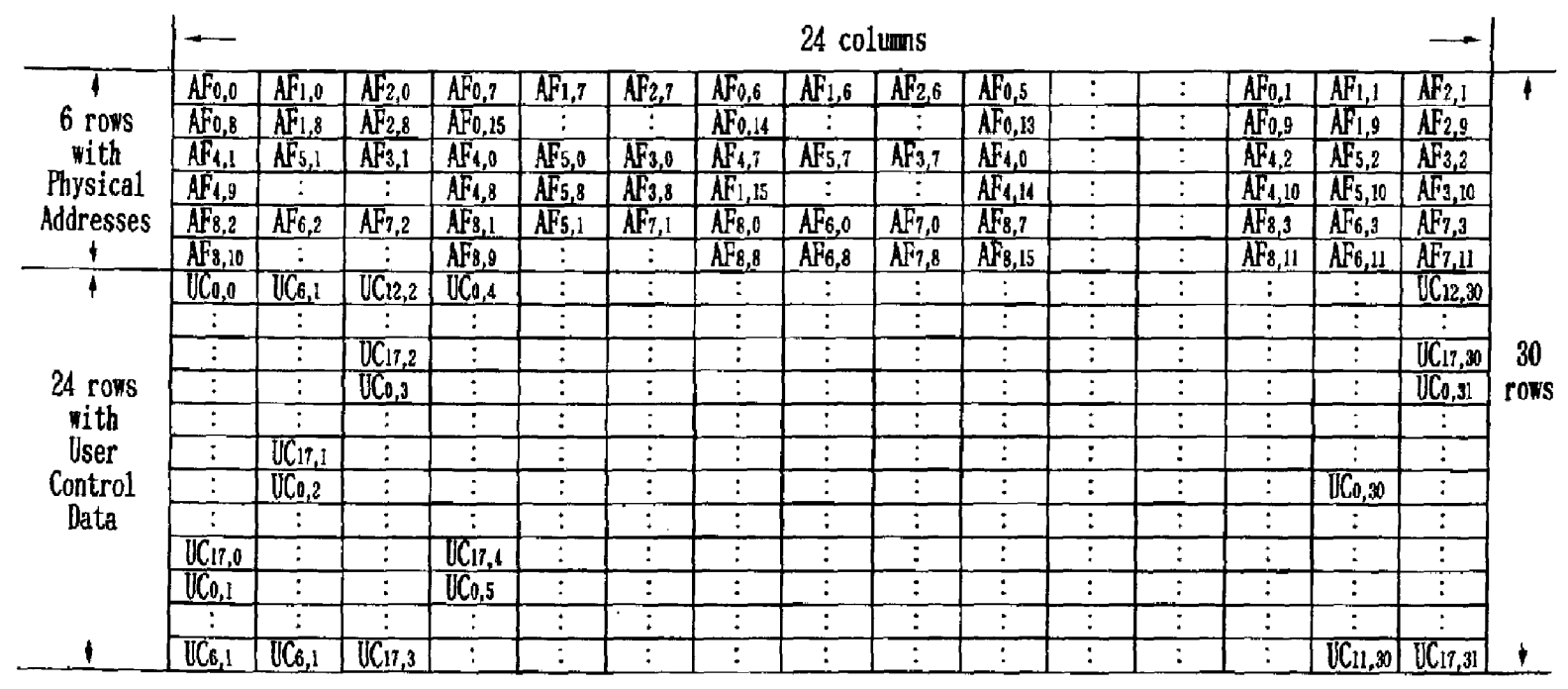
Figure 6C:
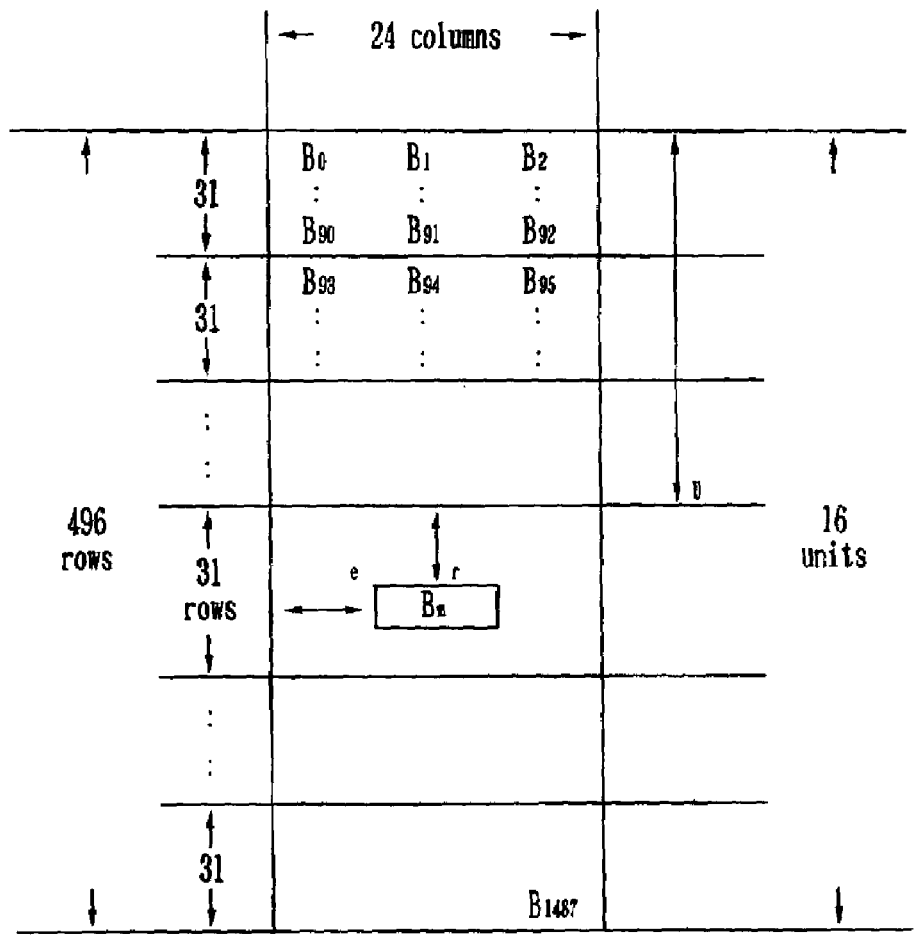

BIS data shown in FIGS. 6(*a*), 6(*b*) and 6(*c*) are composed of address field (AF) information and user control (UC) data, wherein AF comprises addresses and the parities thereof. Because addresses are continuous, all the addresses can be forwardly or backwardly deduced upon a known address. Therefore, the position of AF data of BIS can be compared to that of an expected AF data. If the AF position is different from that of the expected one, which is deemed an erasure indicator. Further, because AF data is protected by coding, the AF decoding results can be erasure indicators. If UC is not specified by the application, the UC data bytes shall be set to 00h. To compare the UC data of BIS and 0, if different, the UC data can be deemed erasure indicators. Because AF and UC are known already, the parity of BIS block can be calculated. The calculated parity can be compared to the data of received parity of BIS, so as to generate erasure indicators. BIS data not only can be marked as erasure by comparing AF or UC expected data or by using segment erasure indicator before BIS ECC decoder, but also can enhance the BIS error correction so that it can marked more erasures to improve the LDC data error correction.

Figure 7:
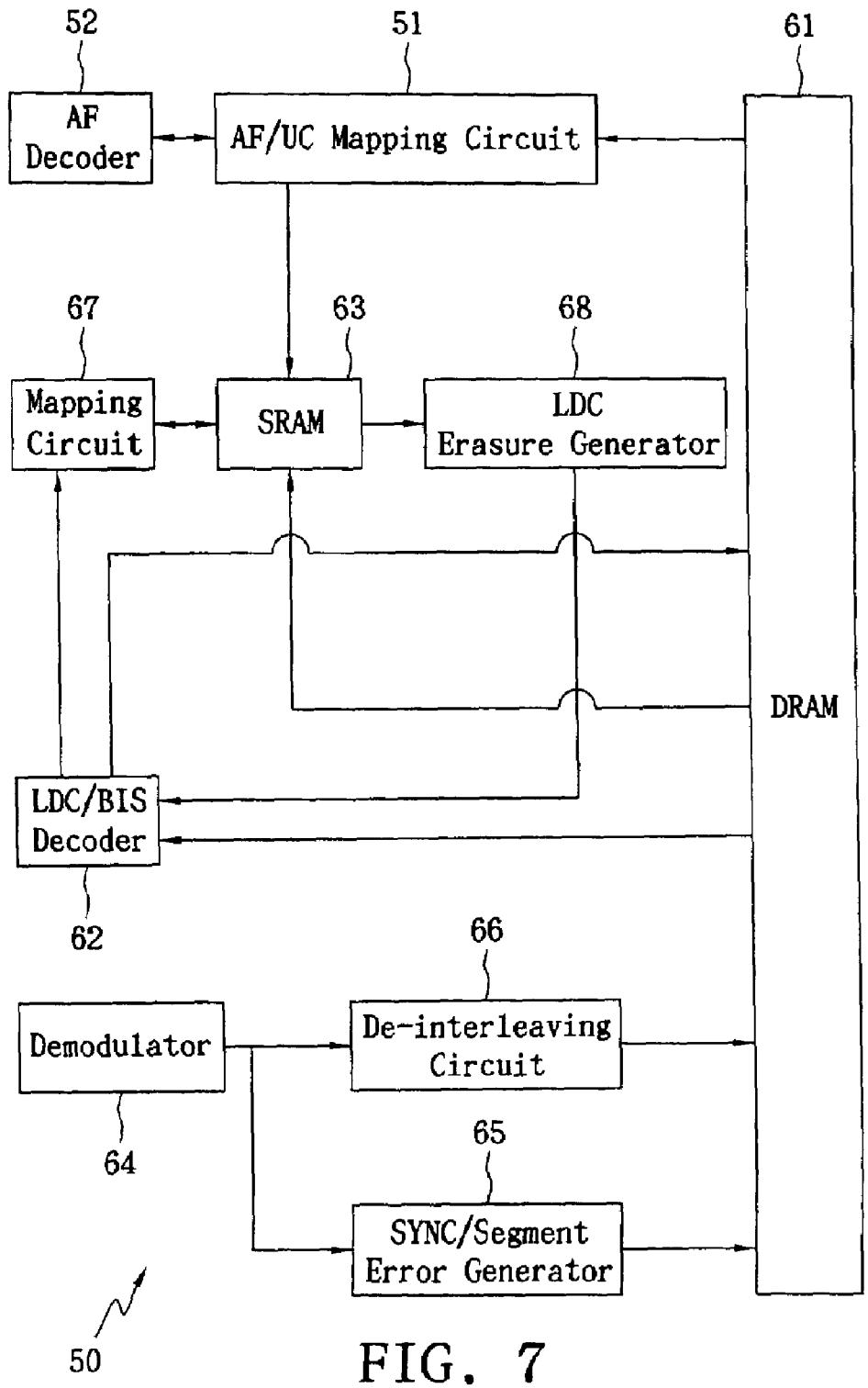
FIG. 7 illustrates an apparatus for decoding LDC clusters of the third embodiment in accordance with the present invention.

Referring to FIG. 7, the address field (AF) information protected by BIS codes for determining the location in a disk and the user control data (UC) can also be used for LDC erasure generation. In comparison with the apparatus 20 in FIG. 2(*a*), an apparatus 50 comprises an AF decoder 52 and an AF/UC mapping circuit 51, which are further added. The user control data (UC) information that is not specified by the application is usually equal to zero. Accordingly, if the address number between close clusters is incorrect, the user control data is not equal to zero, or the errors are detected during AF decoding, they can be deemed to be AF/UC decoding error. The generated AF/UC erasure indicators are stored in the SRAM 23 or in DRAM 21 for LDC erasure bit generation. The generated AF/UC erasure indicators may also integrate with BIS/SYNC/Segment erasure indicators for LDC decoding.

The above strategies of using segment erasure indicators, BIS erasure indicators, SYNC erasure indicators, AF erasure indicators, UC erasure indicators and their combinations can be switched automatically. If the number of the erasure bits exceeds a threshold number, e.g., 32, the erasure bits setting will be automatically switched to another strategy until the number of the erasure bits is smaller than a threshold number.

If any decoding error occurs in the ECC cluster, re-buffering data may need to be performed. Only if those data that failed to pass error detection code (EDC) check, the demodulated data in DRAM 21 needs to be overwritten. As shown in FIG. 8(*b*), in which the LDC data of FIG. 8(*a*) are arranged in order after de-interleaving, and the first and second sectors are exemplified herein. If first sector is passed EDC check, but the second one is not, only the second sector is overwritten when re-buffering into the DRAM. For decoding, LDC codewords 0-8 need not to be decoded due to the pass of EDC check. For decoding codeword 9, because the upper portion belongs to sector "0," and the lower portion belongs to sector "1", the erasure bit of the portion belongs to sector "0" has to be assigned to "0" when the erasure bit is read. The portion for protecting sector "0" is not changed for correction. Accordingly, the re-buffered ECC cluster will be decoded, and the LDC erasure bit uses the previous so-called error detection code (EDC).

An incremental LDC erasure access method may be applied during the LDC decoding. For two close LDC codewords, most erasure bits refer to the same erasure indicators due to the property of interleaving. Only part of erasure bits need to look up different erasure indicators stored in the SRAM 23. As shown in FIG. 8(*a*), owing to interleaving sequence, the erasures of most codewords i and i+2 read the same erasure indicator, except the two codewords i and i+2 are separated in different segments due to interleaving. Therefore, when the erasure of codeword i+2 is read, the portion of erasures across the segment only need to be updated.

Figure 9:
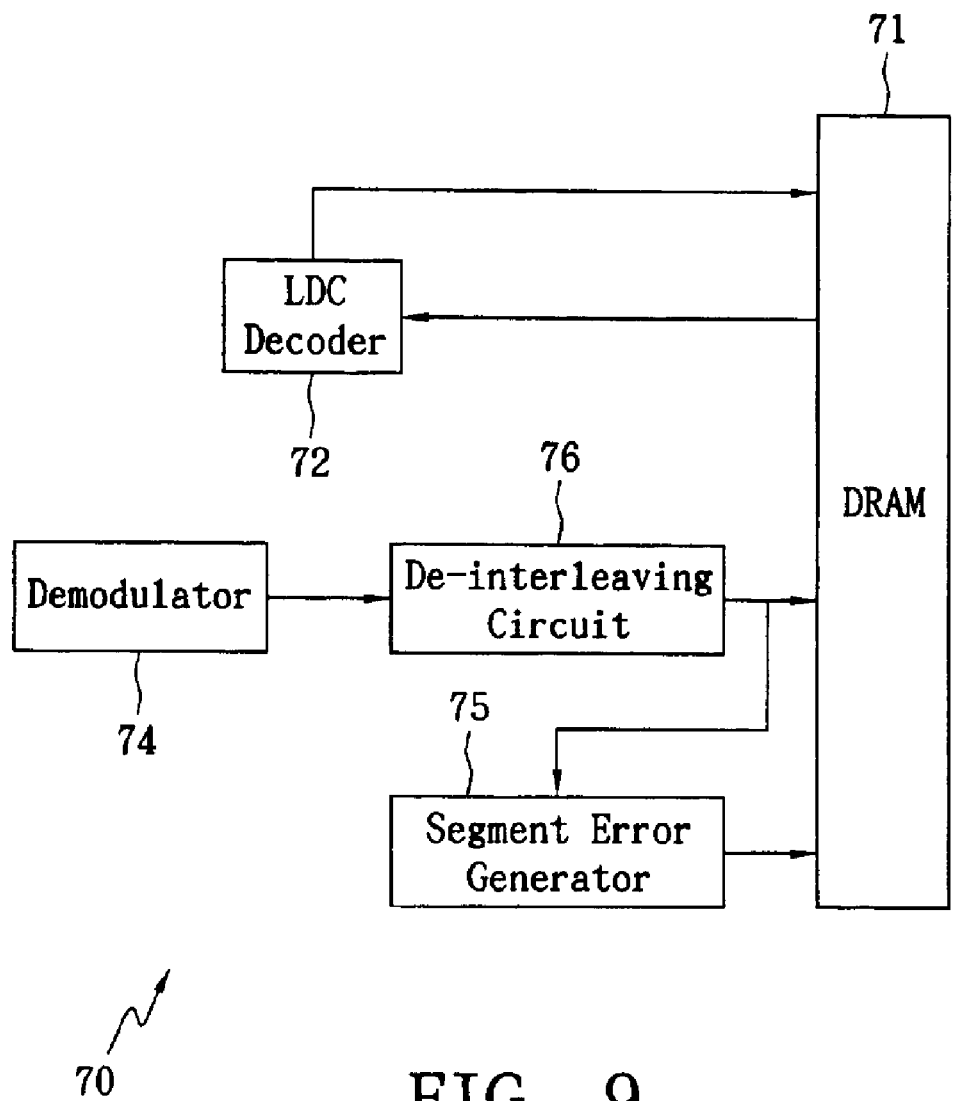
FIG. 9 illustrates other apparatuses for decoding LDC data of the fourth embodiment in accordance with the present invention.

Moreover, an apparatus without SRAM can also be employed. Referring to FIG. 9, an apparatus 70 includes a DRAM 71, a demodulator 74, a segment error generator 75, a de-interleaving circuit 76 and an LDC decoder 72. The segment error can be calculated before or after the de-interleaving circuit and the segment erasure indicator is stored in the DRAM 71 instead of the SRAM 23 for LDC decoding. The LDC data are de-interleaved by the de-interleaving circuit 76, and then errors of the de-interleaved LDC data are detected by the segment error generator 75 so as to generate segment erasure indicators. Nevertheless, because the SRAM, the related mapping circuit and erasure generator can be omitted, a simplified circuit will be acquired.

Figure 8A:
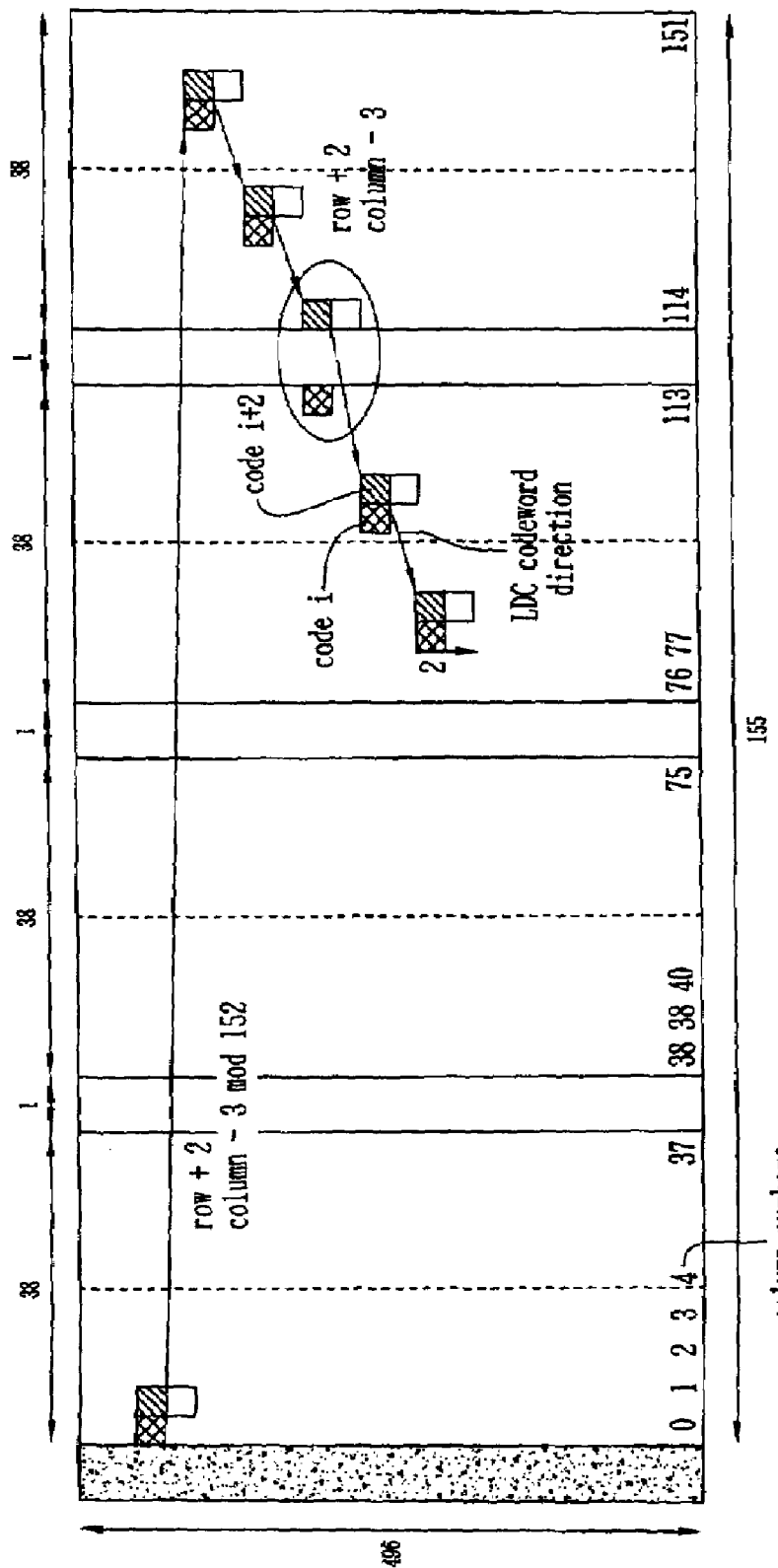
FIG. 8(a) illustrates the correspondence of LDC and SYNC/BIS codes.

In order to reduce the impact of decoding efficiency, the incremental manner to access the erasure indicator region in need of change, as shown in FIG. 8(a), can decrease the impact to DRAM bandwidth. Another erasure indicators access method without exact erasure indicator location mapping may be applied to reduce the DRAM access. As shown in FIG. 8(a), the codewords i and i+2 in the circle are respectively included in two different segments, and therefore the erasure indicator needs to be read again. For saving of DRAM access, the codeword I+2 still uses the erasure indicator of the codeword i In other words, the erasure indicators being read out are used for multiple codewords, and are influenced where the erasure indicator located at different segment. Because there is a simplified erasure indicator location mapping operation, the location for LDC data is relatively inaccurate. This simplified erasure indicator location mapping operation can also be used for the access of SRAM 23 in FIG. 2(a).

Figure 10:
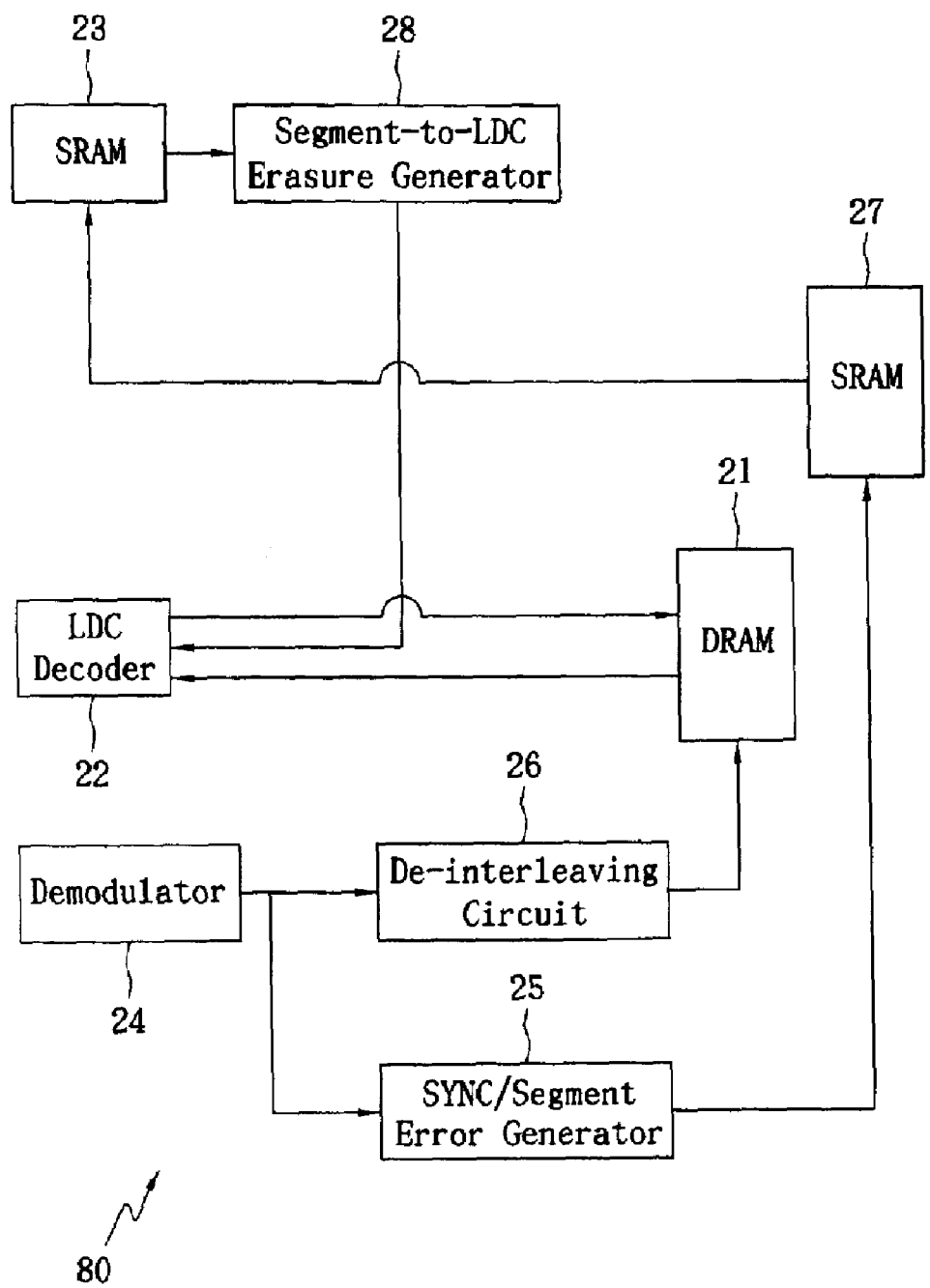
FIG. 10 illustrates an apparatus for decoding LDC clusters of the fifth embodiment in accordance with the present invention.

Alternatively, the LDC data and segment erasure indicators can also be stored in different memories. FIG. 10 illustrates an apparatus 80 based on FIG. 2 except a SRAM 27 is further introduced, in which the DRAM 21 and SRAM 27 are used for storing LDC data and segment erasure indicators, respectively.

The above-described embodiments of the present invention are intended to be illustrative only. Numerous alternative embodiments may be devised by those skilled in the art without departing from the scope of the following claims.

What is claimed as new and desired to be protected by Letters Patent of the United States is:

1. A method for decoding multiword information, comprising the steps of:
   providing a multiword information cluster including high protective words and low protective words;
   partitioning the low protective words into multiple segments;
   detecting any error flag of the low protective words, so as to generate segment erasure indicators;
   storing the segment erasure indicators into a first memory;
   storing the segment erasure indicators read from the first memory into a second memory;
   generating erasure bits of the low protective words based on the segment erasure indicators; and
   decoding the low protective words by means of the erasure bits.

2. The method for decoding multiword information in accordance with claim 1, wherein the multiword information cluster is an error correction code (ECC) cluster, and the high and low protective words are burst indicator subcodes (BIS) and long-distance codes (LDC), respectively.

3. The method for decoding multiword information in accordance with claim 1, wherein the low protective words are stored in the first memory.

4. The method for decoding multiword information in accordance with claim 1, wherein the low protective words are stored in a third memory.

5. The method for decoding multiword information in accordance with claim 1, wherein the error flag is a fault during demodulation of the low protective words.

6. The method for decoding multiword information in accordance with claim 1, wherein the error flag is the data loss of the low protective words.

7. The method for decoding multiword information in accordance with claim 1, wherein the segment erasure indicator is generated if the number of the error flags exceeds a threshold value.

8. The method for decoding multiword information in accordance with claim 1, wherein the low protective words are de-interleaved before being stored into the first memory.

9. The method for decoding multiword information in accordance with claim 1, further comprising the step of:
   decoding the high protective words so as to generate high protective word erasure indicators showing whether decoding errors occur, wherein the high protective word erasure indicators act as references for generating the erasure bits.

10. The method for decoding multiword information in accordance with claim 2, wherein the BIS codes include address field information.

11. The method for decoding multiword information in accordance with claim 10, further comprising the step of:
    decoding the address field information so as to generate address field erasure indicators showing whether decoding errors occur, wherein the address field erasure indicators act as references for generating the erasure bits.

12. The method for decoding multiword information in accordance with claim 1, wherein the multiword information cluster further comprises synchronization codes.

13. The method for decoding multiword information in accordance with claim 12, further comprising the step of:
    detecting any error flag of the synchronization codes so as to generate synchronization erasure indicators showing whether error flag occurs, wherein the synchronization erasure indicators act as references for generating the erasure bits.

14. A method for decoding multiword information, comprising the steps of:
    providing a multiword information cluster including high protective words and low protective words;
    partitioning the low protective words into multiple segments;
    detecting any error flag of the low protective word cluster, so as to generate segment erasure indicators;
    decoding the low protective word cluster by means of the segment erasure indicators.

15. The method for decoding multiword information in accordance with claim 14, wherein the multiword information cluster is an error correction code (ECC) cluster, and the high and low protective words are burst indicator subcodes (BIS) and long-distance codes (LDC), respectively.

16. The method for decoding multiword information in accordance with claim 14, further comprising the step of storing the low protective word cluster and the segment erasure indicators into a memory.

17. The method for decoding multiword information in accordance with claim 14, wherein the error flag is a fault during demodulation of the low protective words.

18. The method for decoding multiword information in accordance with claim 14, wherein the error flag is data loss of the low protective word cluster.

19. The method for decoding multiword information in accordance with claim 14, wherein the segment erasure indicator is generated if the number of the error flags exceeds a threshold value.

20. The method for decoding multiword information in accordance with claim 14, wherein the low protective words are de-interleaved before being stored into the memory.

21. A method for decoding multiword information, comprising the steps of:
   providing a multiword information cluster including synchronization codes and low protective words;
   partitioning the low protective words into multiple segments;
   detecting any error flag of the low protective words, so as to generate segment erasure indicators;
   detecting any error flag of the synchronization codes, so as to generate synchronization erasure indicators;
   storing the synchronization erasure indicators or segment erasure indicators into a first memory;
   storing the synchronization erasure indicators or segment erasure indicators read from the first memory into a second memory;
   generating erasure bits of the synchronization codes or the low protective words based on the synchronization erasure indicators or segment erasure indicators; and
   decoding the low protective words by means of the erasure bits.

22. A method for decoding multiword information, comprising the steps of:
   providing a multiword information cluster including address field information, user control data and low protective words;
   partitioning the low protective words into multiple segments;
   detecting any error flag of the address field information or user control data, so as to generate address field information/user control data erasure indicators;
   detecting any error flag of the low protective words, so as to generate segment erasure indicators;
   storing the address field information/user control data erasure indicators or segment erasure indicators into a first memory;
   storing the address field information/user control data erasure indicators or segment erasure indicators read from the first memory into a second memory;
   generating erasure bits of the address field information or user control data codes or the low protective words based on the address field information/user control data erasure indicators or segment erasure indicators; and
   decoding the low protective words by means of the erasure bits.

23. An apparatus for decoding multiword information, the multiword information including high protective words and low protective words, and the low protective words being partitioned into multiple segments, the apparatus comprising:
   a segment error generator for detecting any error flag in the multiple segments and generating segment erasure indicators showing where errors occur;
   a first memory electrically coupled to the segment error generator for storing the segment erasure indicators;
   a second memory electrically coupled to the first memory for storing the segment erasure indicators read from the first memory;
   an erasure generator electrically coupled to the second memory for generating erasure bits for the low protective words based on the segment erasure indicators; and
   a decoder electrically coupled to the first memory and the erasure generator for decoding the low protective words by the erasure bits.

24. The apparatus for decoding multiword information in accordance with claim 23, wherein the low protective words are stored in the first memory.

25. The apparatus for decoding multiword information in accordance with claim 23, wherein the low protective words are stored in a third memory.

26. The apparatus for decoding multiword information in accordance with claim 23, wherein the decoder is further employed to decode the high protective words so as to generate high protective word erasure indicators, and the erasure bits are marked based on the high protective word erasure indicators.

27. The apparatus for decoding multiword information in accordance with claim 26, further comprising a mapping circuit electrically coupled to the decoder and the second memory for providing localities for the high protective word erasure indicators.

28. The apparatus for decoding multiword information in accordance with claim 23, further comprising a de-interleaving circuit electrically coupled to the first memory for de-interleaving the low protective words.

29. The apparatus for decoding multiword information in accordance with claim 23, wherein the multiword information cluster further comprises synchronization codes.

30. The apparatus for decoding multiword information in accordance with claim 29, wherein the segment error generator is further employed to detect error flags of the synchronization codes so as to generate synchronization erasure indicators for generating the erasure bits.

31. The method for decoding multiword information in accordance with claim 23, wherein the high protective words include address field information.

32. The apparatus for decoding multiword information in accordance with claim 31, further comprising:
   an address field information/use control data mapping circuit for generating address field information/user control data erasure indicators caused by a decoding error or an address error of an address field information or by a user control data error.

33. The apparatus for decoding multiword information in accordance with claim 32, further comprising:
   an address field decoder electrically coupled to the address field information/user control data mapping circuit for decoding the address field information.

34. The apparatus for decoding multiword information in accordance with claim 23, wherein the multiword information is an error correction code (ECC) cluster, and the high and low protective words are burst indicator subcodes (BIS) and long-distance codes (LDC), respectively.

35. The apparatus for decoding multiword information in accordance with claim 23, wherein the first memory is a DRAM.

36. The apparatus for decoding multiword information in accordance with claim 23, wherein the second memory is an SRAM.

37. An apparatus for decoding multiword information, the multiword information including high protective words and low protective words, and the low protective words being partitioned into multiple segments, the apparatus comprising:
- a segment error generator for detecting any error in the multiple segments and generating segment erasure indicators showing where errors occur;
- a memory electrically coupled to the segment error generator for storing the low protective words and the segment erasure indicators; and
- a decoder electrically coupled to the memory for decoding the low protective words based on the segment erasure indicators.

38. The apparatus for decoding multiword information in accordance with claim 37, wherein the multiword information is an error correction code (ECC) cluster, and the high and low protective words are burst indicator subcodes (BIS) and long-distance codes (LDC), respectively.

39. The apparatus for decoding multiword information in accordance with claim 37, wherein the memory is a DRAM.

* * * * *